United States Patent
Sipilä

(10) Patent No.: US 7,293,225 B2
(45) Date of Patent: Nov. 6, 2007

(54) METHOD AND ARRANGEMENT FOR DECODING USING A TRELLIS

(75) Inventor: Teemu Sipilä, Oulunsalo (FI)

(73) Assignee: Nokia Corporation, Espoo (FI)

( * ) Notice: Subject to any disclaimer, the term of this patent is extended or adjusted under 35 U.S.C. 154(b) by 430 days.

(21) Appl. No.: 10/662,691

(22) Filed: Sep. 15, 2003

(65) Prior Publication Data

US 2004/0093553 A1   May 13, 2004

(30) Foreign Application Priority Data

Sep. 16, 2002   (FI) ................................. 20021656

(51) Int. Cl.
*H03M 13/03* (2006.01)
(52) U.S. Cl. ............... 714/795; 714/794; 714/796; 714/792; 375/262; 375/341
(58) Field of Classification Search ............ 714/795, 714/792; 375/341, 262
See application file for complete search history.

(56) References Cited

U.S. PATENT DOCUMENTS

| | | | | |
|---|---|---|---|---|
| 5,027,374 A | * | 6/1991 | Rossman ................... 375/341 |
| 5,327,440 A | * | 7/1994 | Fredrickson et al. ........ 714/795 |
| 5,408,502 A | * | 4/1995 | How ............................. 375/340 |
| 6,111,835 A | * | 8/2000 | Honma ...................... 369/59.13 |
| 6,115,436 A | * | 9/2000 | Ramesh et al. ............. 375/341 |
| 6,148,431 A | | 11/2000 | Lee et al. .................... 714/794 |
| 6,259,749 B1 | * | 7/2001 | Andoh ........................ 375/341 |
| 6,333,954 B1 | * | 12/2001 | Hansquine ................... 375/341 |
| 6,680,986 B1 | * | 1/2004 | Hemmati ..................... 375/341 |
| 6,690,750 B1 | * | 2/2004 | Hocevar et al. ............. 375/341 |
| 6,865,710 B2 | * | 3/2005 | Bickerstaff et al. ......... 714/796 |
| 7,020,827 B2 | * | 3/2006 | Gatherer et al. ............. 714/786 |

FOREIGN PATENT DOCUMENTS

| | | |
|---|---|---|
| EP | 1 024 604 | 2/2000 |
| EP | 1 058 392 | 6/2000 |
| GB | 2 366 495 | 6/2002 |
| WO | WO 01/03308 | 11/2001 |

\* cited by examiner

*Primary Examiner*—Guy Lamarre
*Assistant Examiner*—Esaw Abraham
(74) *Attorney, Agent, or Firm*—Hollingsworth & Funk, LLC

(57) ABSTRACT

A method and arrangement for performing Viterbi decoding by means of a trellis is provided. According to one embodiment, the arrangement comprises one or more ACS units. Connections between the inputs and outputs of the ACS units are implemented in such a manner that in calculating the consecutive metrics of the trellis, the calculated metrics of the previous stage of the trellis obtained from the outputs of the ACS units are directly connected to the inputs of the ACS units to be used in the calculation of the next stage of the trellis.

17 Claims, 4 Drawing Sheets

METHOD AND ARRANGEMENT FOR DECODING USING A TRELLIS

FIELD

Figure 1:
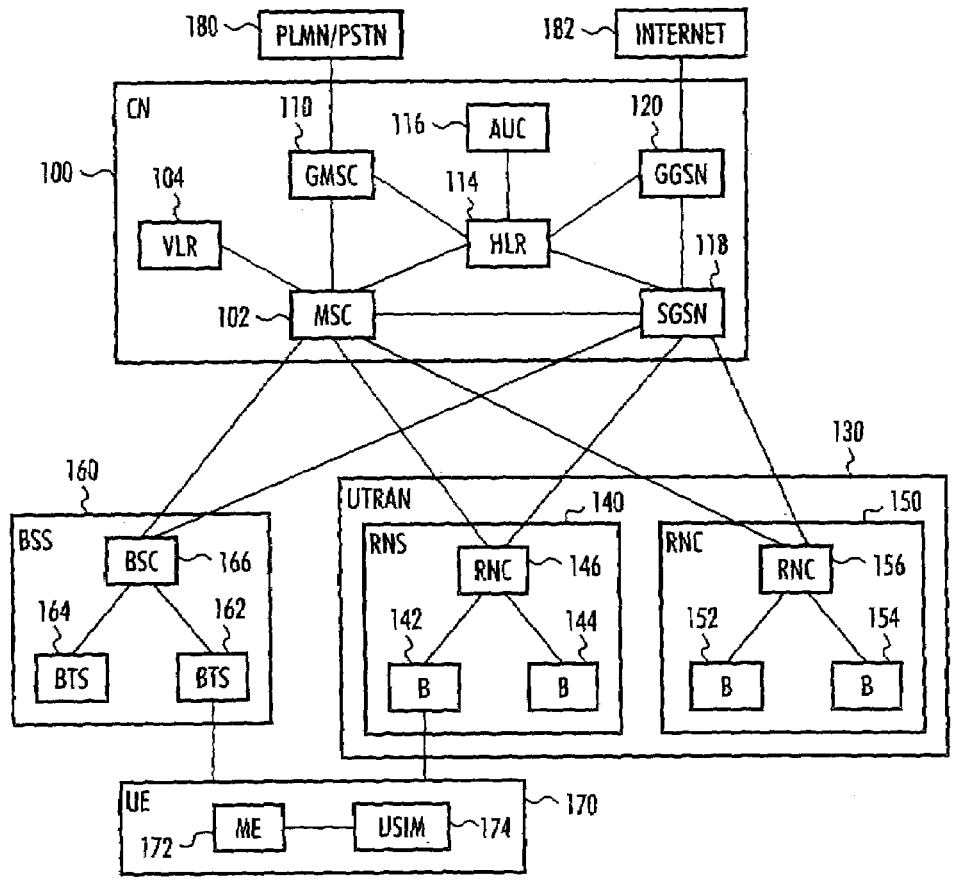

The invention relates to a method and arrangement for performing Viterbi decoding. In particular, the invention relates to calculating path metrics.

BACKGROUND

The channel used in telecommunications systems often causes interference to data transmission. Interference occurs in all kinds of systems, but especially in wireless telecommunications systems, the transmission path attenuates and distorts in many different ways the signal being transmitted. The multipath propagation of the signal, different fades and reflections, and other signals being transmitted on the same transmission path typically cause interference on the transmission path.

To reduce the impact of the interference, several coding methods have been developed to protect signals from interference and to endeavour to eliminate errors caused by interference in signals. Convolutional coding is a much-used coding method. In convolutional coding, the signal to be transmitted that is made up of symbols is coded into code words that are based on the convolution of the symbols to be transmitted with so-called generator polynomials (coding polynomials). The coding ratio and coding polynomials define the convolutional code. The coding ratio (k/n) refers to the number (n) of the produced coded symbols in relation to the number (k) of the symbols to be coded. The coder is often a shift register. The constraint length (K) of a code often refers to the length of the shift register. The coder can be considered a state machine having $2^{K-1}$ states.

A receiver decodes the coded signal that propagated through the channel. A convolutional code is usually decoded using a trellis whose nodes describe the states of the encoder used in coding the signal, and the paths between the nodes belonging to different stages of the trellis describe the allowed state transitions. A decoder tries to find out the consecutive states of the coder, i.e. the transitions from one state to another. To find out the transitions, the decoder calculates metrics, of which there are two types: path metrics (or state metrics) and branch metrics. Path metrics represent the probability of the set of symbols in the received signal leading to the state described by the node in question. Branch metrics represent the probabilities of different transitions.

The basic element in calculating a trellis is a unit known as the ACS (Add, Compare, Select) unit, by means of which path metrics are calculated in the nodes by using the path metrics of the previous nodes and branch metrics between the nodes. To improve the efficiency of the equipment, two ACS units are often combined as a twin unit, also called a butterfly. Each unit can thus calculate two nodes simultaneously.

A convolutional code is usually decoded by means of the Viterbi algorithm. The Viterbi algorithm is a computationally demanding task. A general problem with the Viterbi algorithm is that when the constraint length of the convolutional code is long (e.g. 9, as in WCDMA of the UMTS system), the Viterbi algorithm must search through $2^{(9-1)}$, i.e. 256, states to decode one bit. To achieve sufficient speed for such calculation, the calculation of several ACS units must be performed in parallel. A set of parallel twin ACS units is generally called a bank. There are typically fewer parallel ACS units than states in a trellis. This is why the calculated metrics must be stored in a cache memory. In implementations according to the prior art, there is one memory read-write operation per each new calculated metric. Therefore, the memory size is large and the data buses over which information is transmitted between the memories and ACS units are large. This in turn decreases the integration density when performing the calculation by hardware. For instance, if the implementation comprises 32 parallel ACS units and the path metric is presented as 12-bit figures, the memory and data bus is 384 bits wide.

When the calculation is done by software, the performance of the decoder software is decreased by high memory usage that is substantially slower than the use of processor registers. The number of registers in a processor is limited.

BRIEF DESCRIPTION OF THE INVENTION

It is an object of the invention to provide a method and an arrangement for performing decoding in an advantageous manner. The invention provides a method for performing Viterbi decoding by means of a trellis, in which a set of consecutive metrics of the trellis is calculated using the metrics of the previous stage of the trellis calculated by one or more ACS units directly as input for one or more ACS units to be used in the calculation of the next stage of the trellis.

The invention also provides an arrangement for performing Viterbi decoding by means of a trellis, which arrangement comprises one or more ACS units. Connections between the inputs and outputs of the ACS units are implemented in such a manner that in calculating the consecutive metrics of the trellis, the calculated metrics of the previous stage of the trellis obtained from the outputs of the ACS units are directly connected to the inputs of the ACS units to be used in the calculation of the next stage of the trellis.

In one embodiment, the input pairs of the ACS units are selected and the connections between the twin units are grouped so as to minimize the storing of the metrics into a memory during the calculation. Because the use of a cache memory is slow, the solution provides the advantage, for instance, that the calculation can be done quickly. The solution is suited for both hardware and software solutions.

The solutions of the preferred embodiments can be utilized in all applications that use a trellis. In addition to the above-mentioned decoding of convolutional coding, such applications include the decoding of other types of code, equalization, multiuser decoding and speech recognition.

LIST OF FIGURES

Figure 2A:
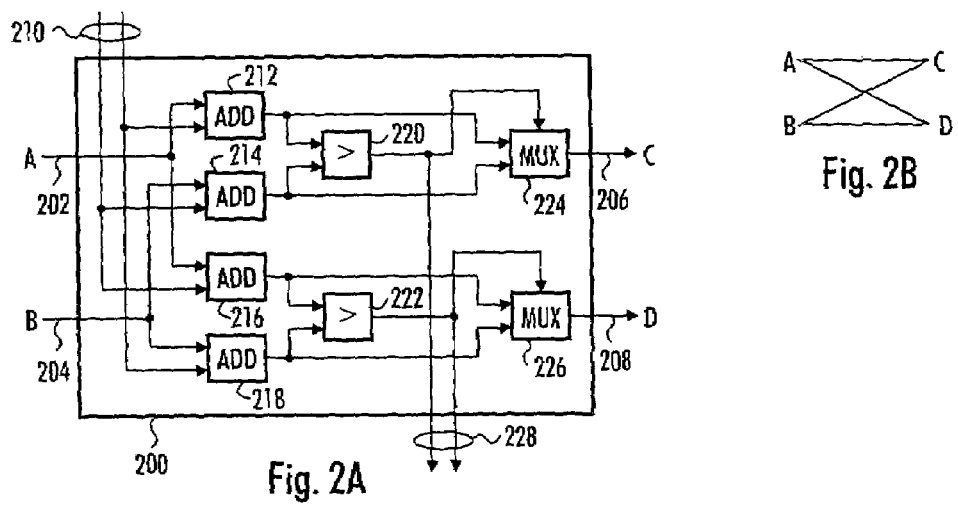
Figure 2B:
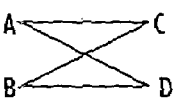
Figure 3A:
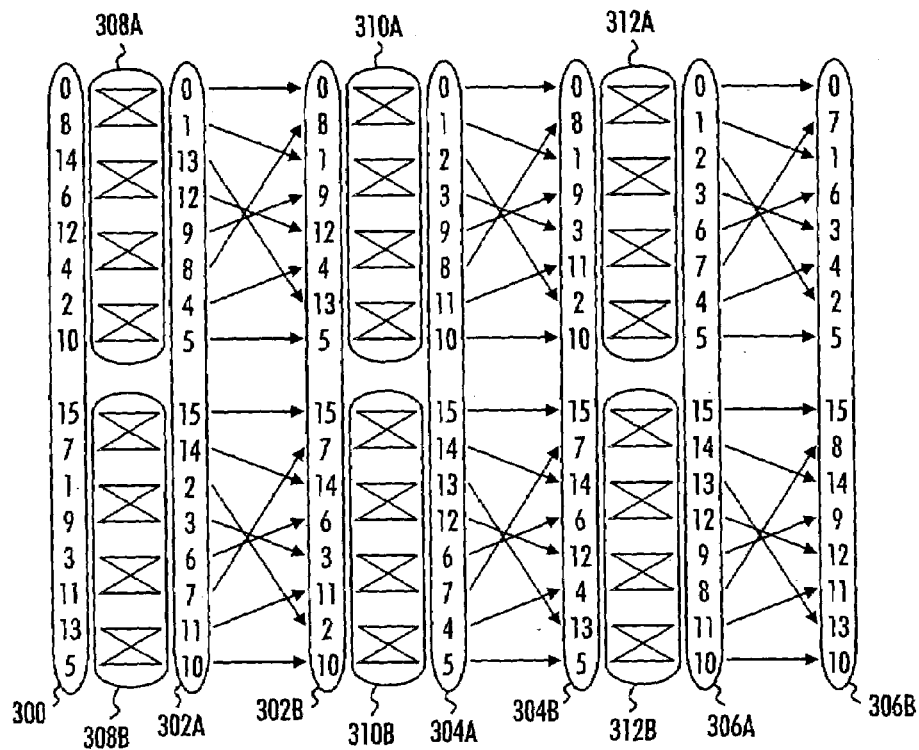
Figure 3B:
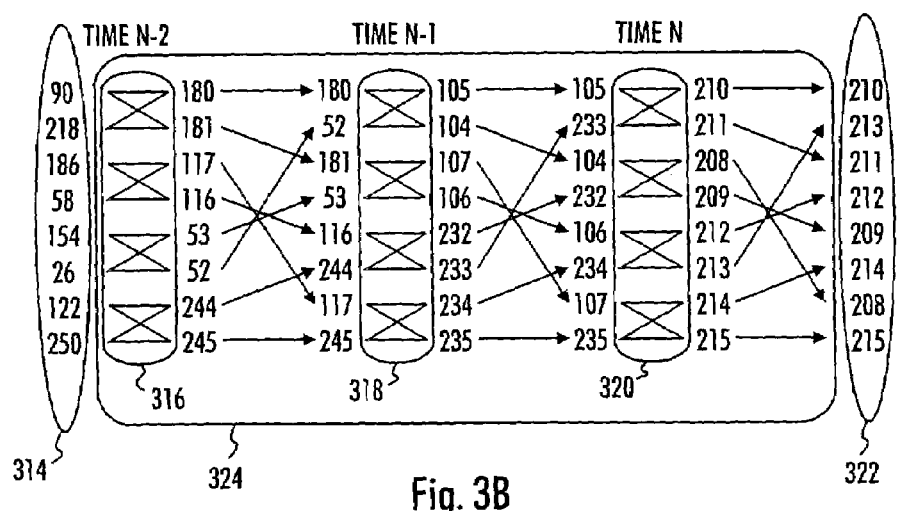
Figure 4A:
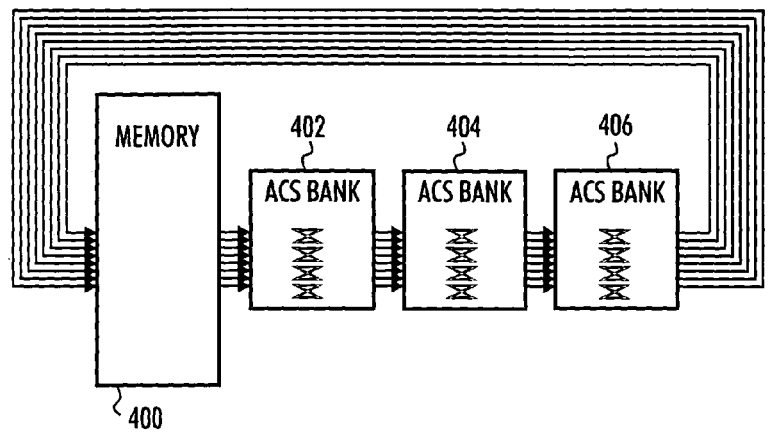
Figure 4B:
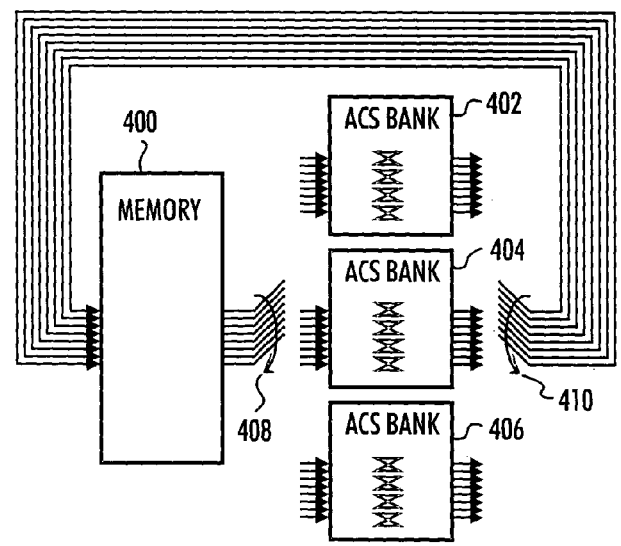
Figure 4C:
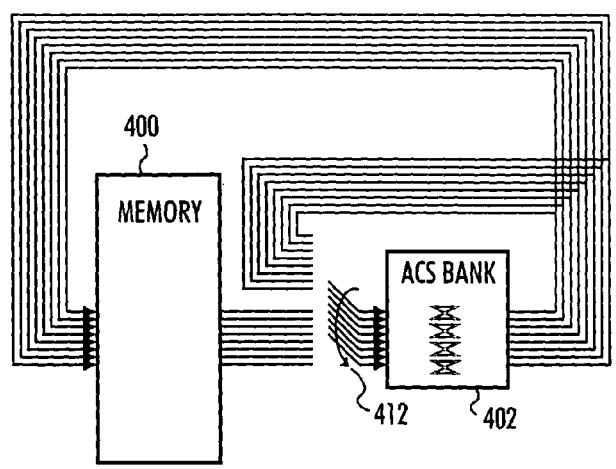
Figure 5:
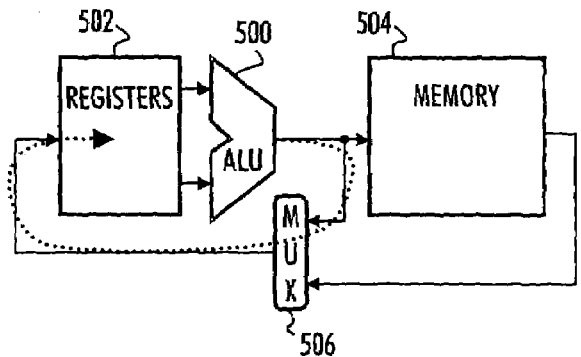
Figure 6:
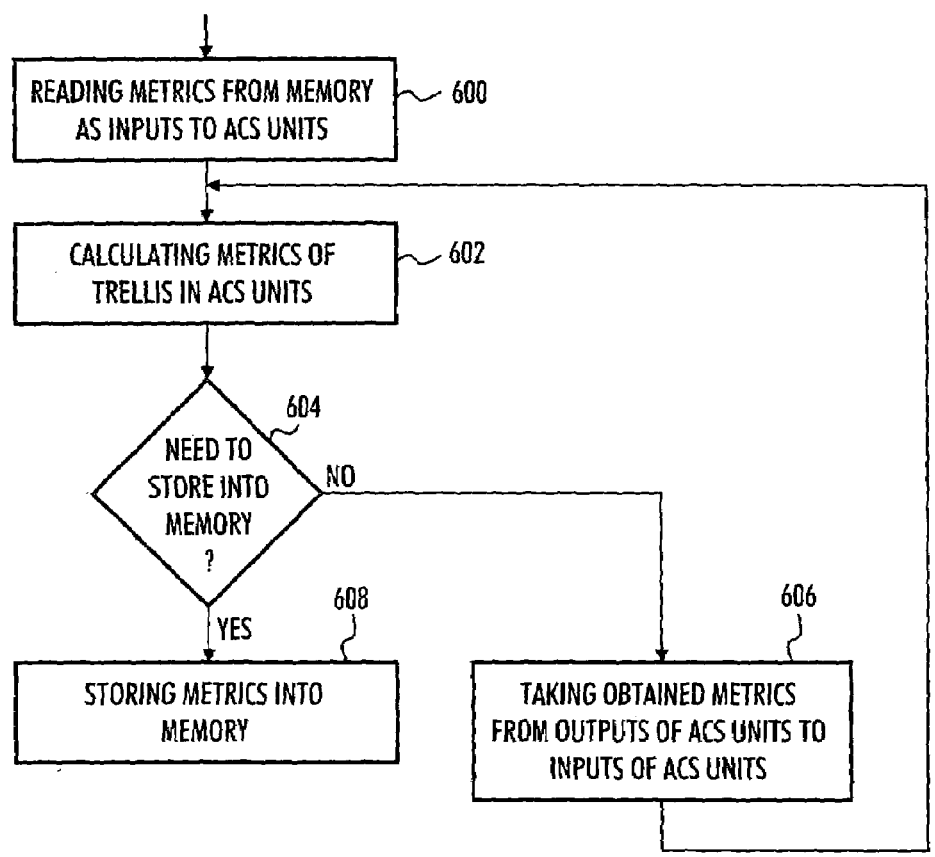

The invention will now be described in more detail by means of the preferred embodiments and with reference to the attached drawings, in which FIG. 1 is a simplified block diagram of the structure of radio systems, FIGS. 2A and 2B show an ACS unit, FIGS. 3A and 3B show connections between ACS units, FIGS. 4A to 4C illustrate examples of embodiments, FIG. 5 is an example of a software solution, and FIG. 6 illustrates the invention by means of a flow chart.

DESCRIPTION OF THE EMBODIMENTS

FIG. 1 shows an example of a data transmission system to which the preferred embodiments can be applied. One possible system is for instance UMTS (Universal Mobile Telecommunications System), other wideband systems can also be used. In the following, the preferred embodiments are described using the UMTS system as an example, without, however, being limited to it as is clear to a person skilled in the art.

Let us now clarify the terminology used in the application. A radio system refers herein to the radio access technology layer RAT of telecommunications systems that belongs to the access stratum AS above which the telecommunications systems comprise a non-access stratum NAS utilizing the services of separate radio systems.

Let us now examine FIG. 1 that illustrates the structure of radio systems. FIG. 1 is a simplified block diagram that shows the most important parts of radio systems and the interfaces between them on network-element level. The structure and functions of the network elements are not described in detail, because they are generally known.

In FIG. 1, a core network CN 100 depicts the non-access stratum of the telecommunications system. A first radio system, i.e. radio access network 130, and a second radio system, i.e. a base station system BSS 160, depict the radio systems. The figure also shows user equipment UE 170. The term UTRAN comes from UMTS Terrestrial Radio Access Network, i.e. the radio access network 130 is implemented using wideband code division multiple access technology WCDMA. The base station system 160 is implemented using time division multiple access technology TDMA.

On a general level, it is also possible to say that the radio system is made up of user equipment, also known as subscriber terminal and mobile phone, and a network part containing the fixed infrastructure radio access network or base station system of the radio system.

The structure of the core network 100 corresponds to a combined GSM and GPRS system structure. The GSM network elements take care of circuit-switched connections and the GPRS network elements take care of packet-switched connections, some of the network elements are, however, in both systems.

A mobile services switching centre MSC 102 is the centre point of the circuit-switched side of the core network 100. The same mobile services switching centre 102 can be used to serve the connections of both the radio access network 130 and base station system 160. The tasks of the mobile services switching centre 102 include: switching, paging, location registration, handover management, collection of subscriber billing information, encryption parameter management, frequency allocation management and echo cancellation. The number of mobile services switching centres 102 may vary: a small network operator may only have one MSC 102, but large core networks 100 may include several of them.

Large core networks 100 may have a separate gateway mobile service switching centre GMSC 110 that takes care of the circuit-switched connections between the core network 100 and external networks 180. GMSC 110 is located between the mobile services switching centres 102 and the external networks 180. A public land mobile network PLMN or public switched telephone network PSTN are examples of an external network 180.

A home location register HLR 114 contains a permanent subscriber register, i.e. the following information, for instance: international mobile subscriber identity IMSI, mobile subscriber ISDN number MSISDN, authentication key, and packet data protocol PDP address when the radio system supports GPRS.

A visitor location register VLR 104 contains roaming information on user equipment 170 in the area of the mobile services switching centre 102. The visitor location register 104 contains much the same information as the home location register 114, but in the visitor location register 104, the information is only temporarily.

An authentication centre AuC 116 always resides physically in the same place as the home location register 114 and contains an individual subscriber authentication key Ki, CK (ciphering key) and a corresponding IMSI.

The network elements shown in FIG. 1 are functional entities whose physical implementation may vary. The mobile services switching centre 102 and the visitor location register 104 usually form one physical device and the home location register 114 and the authentication centre 116 another physical device.

A serving GPRS support node SGSN 118 is the centre point of the packet-switched side of the core network 100. The main task of SGSN 118 is to transmit and receive packets with the user equipment 170 supporting packet-switched transmission by using the radio access network 130 or base station system 160. SGSN 118 contains subscriber information and location information concerning the user equipment 170.

A gateway GPRS support node GGSN 120 is the packet-switched side counterpart to the circuit-switched side gateway mobile services switching centre 110 with the exception, however, that GGSN 120 must also be capable of routing outgoing traffic from the core network 100 to the external networks 182, whereas GMSC 110 only routes incoming traffic. In our example, the Internet represents the external networks 182.

The first radio system, i.e. the radio access network 130 is made up of radio network subsystems RNS 140, 150. Each RNS 140, 150 is made up of radio network controllers RNC 146, 156 and B nodes 142, 144, 151, 154. The B node is a rather abstract concept and instead of B node, it is often called a base station.

The radio network controller 146 controls the B nodes 142, 144 under it. In principle the aim is that the equipment implementing the radio path including the related functions resides in the B nodes 142, 144 and the control equipment resides in the radio network controller 146.

The radio network controller 146 takes care of the following tasks, for instance: radio resource management of the B node 142, 144, intercell handovers, frequency management, i.e. frequency allocation to the B nodes 142, 144, frequency hopping sequence management, time delay measurement on the uplink, implementation of the interface to operation and maintenance, and power control management.

The B node 142, 144 contains one or more transceivers implementing a WCDMA radio interface. Typically, the B node serves one cell, but it is also possible to have a solution where the B node serves several sectored cells. The diameter of a cell can vary from a few meters to tens of kilometers. The B node 142, 144 has the following tasks, for instance: calculation of TA (timing advance), uplink measurements, channel coding, encryption, decryption, and frequency hopping.

The second radio system, i.e. base station system, 160 is made up of a base station controller BSC 166 and base transceiver stations BTS 162, 164. The base station controller 166 controls the base transceiver stations 162, 164. In principle the aim is that the equipment implementing the radio path including the related functions resides in the base transceiver stations 162, 164 and the control equipment resides in the base station controller 166. The base station controller 166 takes care of essentially the same tasks as the radio network controller.

The base transceiver station 162, 164 contains at least one transceiver that implements one carrier, i.e. eight time-slots, i.e. eight physical channels. Typically one base transceiver station 162, 164 serves one cell, but it is also possible to have a solution where one base transceiver station 162, 164 serves several sectored cells. The base transceiver station 162, 164 is also considered to comprise a transcoder that transforms between the speech-coding format used in the radio system and the speech-coding format used in the public telephone network. In practice, the transcoder, however, usually resides physically in the mobile services switching centre 102. The base transceiver station 162, 164 has the same tasks as the B node.

The user equipment 170 comprises two parts: mobile equipment ME 172 and UMTS subscriber identity module USIM 174. The user equipment 170 contains at least one transceiver that establishes a radio link to the radio access network 130 or base station system 160. The user equipment 170 can contain at least two different subscriber identity modules. In addition, the user equipment 170 contains an antenna, user interface and battery. Today, there are various kinds of user equipment 170, such as those installed in a car and portable ones.

USIM 174 contains information related to the user and especially information related to information security, such as an encryption algorithm.

Let us next examine Viterbi decoding. One of the basic operations of Viterbi decoding is an operation known as add-compare-select ACS. To present it simply, when calculating a Viterbi algorithm, the value of a branch metric is added to an earlier path metric, a comparison is made between the obtained values and the largest value is selected as the new path metric. In terms of a hardware implementation, the ACS operation should preferably be performed in pairs. This way, a unit is obtained that performs two ACS operations and has two common inputs and outputs. This type of unit is called a butterfly in the trade literature.

ACS operations can be performed either by hardware or software. In a hardware solution, the connections between the units of the preferred embodiments of the invention are selected in such a manner that a set of consecutive metrics of a trellis is calculated without storing the metric values into a memory, i.e. by using the calculated metrics from the previous trellis stage directly as inputs of the calculation of the next trellis stage. In a software implementation, a corresponding solution affects the storing methods between the input and output data.

FIG. 2A shows an example of the implementation of such a twin ACS unit 200. The path metrics of two nodes in the previous column are used as inputs 202, 204. Two new path metrics of the next column are used as output 206, 208. Branch metrics are also used as input 210. The unit comprises four adders 212 to 218, in which the path metrics and branch metrics are summed. The outputs of the adders are taken to comparators 220, 222 that check which of the sums are the largest or smallest, depending on the implementation method. Decision signals are transmitted from the comparators to multiplexers 224, 226 that direct the selected sums to the output as path metrics of the next column. The decision signals can also be taken as output 228 from the unit. FIG. 2B shows a simplified presentation method of a twin unit. For the sake of clarity, branch metrics are not shown in the figure.

In one embodiment, the input pairs of the twin units are selected and the connections between the twin units are grouped in such a manner that the need for a cache memory is minimized. The grouping and connections of the twin units are selected in such a manner that the path metrics in the output of the twin unit can be immediately used as an input signal for the next twin unit. The path metrics in the outputs need then not be stored in a cache memory. Let us first examine binary trellises, in which one state can be reached from two states and correspondingly, two states can be reached from one state. If the number of data paths is P, it is possible to calculate $\log_2 P$ path metrics for one memory read/write operation. This means that one state can be reached from two states in the previous column and each of these two states can have been reached from two states in the column previous to that, etc. That is, a certain state can be reached through x steps of $2^x$ different states. In the presented solution, the connections are arranged in such a manner that no more than $2^x$ states required for the calculation of the state in question are calculated through x steps. In other words, $x = \log_2 P$ and $2^x = P$. The connections can preferably be selected so that the same connection can be applied to calculating several columns.

In other than binary trellises, i.e. trellises in which one state can be reached from more than two states and correspondingly, more than two states can be reached from one state. The above $\log_2 P$ then changes into $\log_Y p$, wherein Y is the number of connections leaving/entering one state.

Let us examine FIG. 3A that illustrates connections between twin units. The figure shows the calculation of a 16-state code trellis. Each column thus has 16 states numbered 0 to 15. The figure shows fours trellis columns 300, 302A, 304A and 306A. The implementation uses two banks of four twin units. Thus, the number of data paths is eight. The path metrics of the first column 300 read from a cache memory are the first inputs for the two twin-unit banks 308A and 308B. The path metrics of the next column 302A are in the output of the twin units. The figure further shows the same column 302B regrouped. The lines between the columns 302A and 302B show the regrouping. By means of regrouping, the path metrics in the output of the twin units 308A and 308B are directed to the inputs of the next twin units 310A and 310B in such a manner that a cache memory is not needed. Correspondingly, the outputs 304A of the twin units 310A and 310B are grouped to form 304B to the inputs of the twin units 312A and 312B. The metrics 306A in the output of the twin units 312A and 312B can also be grouped to form 306B, after which they are stored into the cache memory. Because there are 8 paths in the example of FIG. 3A, $8*\log_2(8)=24$ path metric calculations can be performed per eight read/write operations. The read operations are thus performed to the metrics 300 and the write operations to the metrics 306B.

As can be seen from FIG. 3A, grouping can be done in such a manner that the lines are the same between different columns. This facilitates the implementation of the equipment. It is for instance possible to utilize banks of four twin units in the implementation as shown in FIG. 3A. The twin unit bank and the following grouping repeat in the same manner six times in the example of FIG. 3A, so the same banks can be utilized during different stages of the calculation.

FIG. 3B illustrates another example. The figure shows a section of a 256-state code. At time instant n-2, path metrics 314 are read from a memory and taken to a twin unit bank 316. The calculated metrics are further taken to twin units 318 and 320, from the output of which metrics 322 are obtained and written into the memory. In steps 324, the path metrics are processed locally and no memory read/write is thus necessary.

Calculating a trellis by means of twin units and the connections between the units can be implemented in several different ways. Let us examine FIGS. 4A to 4C. FIG. 4A shows a memory 400 and three twin-unit banks 402, 404, 406 in a cascade connection. The metrics calculated in the previous bank can be directly taken to the inputs of the next bank without using a cache memory. For instance, if the number of data lines is eight and each bank thus has four twin units, three banks can preferably be connected after each other, and the outputs of the third bank 406 are written into the memory.

Let us examine the implementation of the example in FIG. 3A by means of the arrangement in FIG. 4A. In the first step, the bank 402 reads from the memory 400 to its inputs the eight highest values of the path metrics 300 and performs the calculation. The results, i.e. the eight highest values of the metrics 302A, are entered as input to the bank 404. At the same time, the bank 403 reads from the memory 400 to its input the eight lowest values of the path metrics 300. The banks 402 and 404 perform the calculation and the result of the bank 404 (the eight highest values of the path metrics 304A) is entered as input of the bank 406, and correspondingly, the result of the bank 402 (the eight lowest values of the path metrics 302A) is entered as input of the bank 404. The bank 402 does not calculate at this point. The banks 404 and 406 perform the calculation, and the result of the bank 406 (the eight lowest values of the path metrics 306A) is written into the memory 400. The result of the bank 404 (the eight lowest values of the path metrics 304A) is entered as input of the bank 404. Finally, the bank 406 performs the last calculation and the result of the bank 406 (the eight highest values of the path metrics 306A) is written into the memory 400. Trellis calculation can be concatenated in such a manner that there is no idle time in the banks.

FIG. 4B shows the memory 400 and three twin-unit banks 402, 404, 406 in a parallel connection. The arrangement comprises switches 408, 410 for guiding the path metrics between the memory and banks.

FIG. 4C shows the memory 400 and one twin-unit bank 402. The arrangement comprises a switch 412 for guiding the path metrics between the memory and bank. For instance when performing the calculation of FIG. 3A, the arrangement of FIG. 4C allows the path metrics to be taken directly from the output of the bank back to the input of the bank. Initially, the switch 412 is in its low position and the bank 402 reads from the memory to its inputs the eight highest values of the path metrics 300 and performs the calculation. The switch is turned to its top position and the results, i.e. the eight highest values of the metrics 302A, are re-entered to the input of the bank 402. The bank 402 performs the calculation and the result (the eight highest values of the path metrics 304A) is re-entered to the input of the bank 402. The bank 402 re-calculates once more and the result (the eight highest values of the path metrics 306A) is written to the memory 400. The switch is turned to its low position and the bank can read new path metrics from the memory 400.

FIG. 5 illustrates an example in which the calculation is performed by program. The figure shows an arithmetic logic unit ALU 500 that is responsible for the performance of calculations in a typical processor. The arithmetic logic unit obtains the data it requires for the calculation from registers 502 that are quickly readable storage locations. The number of the registers is limited even in the present processor solutions, so in addition to them, the processor also comprises a memory 504, into which processed data, such as intermediate results that do not fit into the registers, can be stored. The read/write operations of the memory 504 are substantially slower than the processing of the registers. The processor is clock pulse-controlled in such a manner that one calculation or register read/write operation is typically performed during one clock cycle. Memory 504 read/write takes several clock cycles. The clock pulse is not shown in FIG. 5.

Reading data from the arithmetic logic unit 500 to the registers 502 or transmitting data from the memory 504 to the registers 502 is done through a multiplexer 506. If the result of the calculation is for instance taken from the arithmetic logic unit 500 to the memory 504, it typically takes more than one clock cycle. Reading data from the memory 504 to the arithmetic logic unit through the multiplexer 506 and registers 502 takes three clock cycles. The result of the calculation is taken from the arithmetic logic unit to the memory 504, which takes one clock cycle. If the result of the calculation is taken from the arithmetic logic unit to the registers 502, it takes one clock cycle.

In the preferred embodiments of the invention, the results of the calculation need not be stored into the memory 504, but the data can be kept in the registers, since the output data of the previous step serves directly as the input data of the next step. Fewer clock cycles are then required for data transmission and the calculation becomes faster. If 16 registers are allocated for the storage of the path metrics, the use of the memory 504 is reduced by 75%. If 8 registers are allocated for the storage of the path metrics, the use of the memory 504 is reduced by 66%.

The connections between the ACS units and/or the grouping of the path metrics can be stored into the memory or state machines in advance. Another alternative is to perform the definition of the connections during decoding. If the definition of the connections or the grouping of the path metrics is done during decoding, a state machine is then needed that provides the correct values at the correct time.

Let us yet examine the flow chart of FIG. 6 that illustrates an embodiment. In step 600, a set of metrics is read from a memory as input into ACS units. In step 602, the metrics of the next stage of the trellis is calculated in the ACS units. If it is not yet necessary 604 to store the calculation results into the memory, the obtained metrics are in step 606 taken from the outputs of the ACS units to the inputs of the ACS units for the calculation of the next stage of the trellis. Steps 602 and 606 are repeated one or more times. When it is necessary to store the calculation results into the memory, this is done in step 608. The need to store the results into the memory thus occurs when $\log_2 P$ path metrics have been calculated per one memory read/write operation, wherein P is the number of parallel data paths.

Even though the invention has been explained in the above with reference to an example in accordance with the accompanying drawings, it is apparent that the invention is not restricted to it but can be modified in many ways within the scope of the attached claims.

The invention claimed is:

1. An arrangement for performing Viterbi decoding using a trellis, which the arrangement comprises one or more Add, Compare, Select ("ACS") units, wherein connections between the inputs and outputs of the ACS units are implemented in such a manner that in calculating consecutive metrics of the trellis, the calculated metrics of the previous stage of the trellis obtained from the outputs of the ACS units are directly connected to the inputs of the ACS units to be used in the calculation of the next stage of the trellis and the arrangement further comprises a memory for storing the calculation results and that the connections between the inputs and outputs of the ACS units are implemented in such a manner that $\log_Y P$ path metrics are calculated per one memory read/write operation pair, wherein P is the number of data paths and Y is the number of branches from/to a state.

2. The arrangement as claimed in claim 1, wherein the ACS units are arranged to calculate Y ACS operations each, wherein Y is the number of branches from/to a state.

3. The arrangement as claimed in claim 1, wherein the arrangement comprises ACS banks made up of several ACS units.

4. The arrangement as claimed in claim 3, wherein the arrangement comprises ACS banks in a cascade connection.

5. The arrangement as claimed in claim 3, wherein the arrangement comprises ACS banks in a parallel connection.

6. The arrangement as claimed in claim 3, wherein the output of the ACS bank used in the calculation is connectable back to the input of the bank.

7. The arrangement as claimed in claim 3, wherein the ACS bank is implemented by program in a processor.

8. The arrangement as claimed in claim 7, wherein the processor is arranged to store the calculated metrics of a previous stage of the trellis into a register and to read the stored metrics from the register when calculating the metrics of the next stage of the trellis.

9. A method for performing Viterbi decoding using a trellis, comprising:
   calculating by one or more Add, Compare, Select ("ACS") units a set of consecutive metrics of the trellis using metrics of a previous stage of the trellis calculated by one or more ACS units directly as input;
   storing the calculation results into a memory and calculating $\log_Y P$ path metrics per one memory read/write operation pair, wherein P is the number of data paths and Y is the number of branches from/to a state; and
   generating decoded data based upon the calculated set of consecutive metrics.

10. The method as claimed in claim 9, further comprising performing the calculation with ACS banks made up of several ACS units.

11. The method as claimed in claim 10, further comprising connecting the ACS banks used in the calculation in a cascade.

12. The method as claimed in claim 10, further comprising connecting the ACS banks used in the calculation in parallel.

13. The method as claimed in claim 10, further comprising performing the decoding by program.

14. The method as claimed in claim 13, further comprising storing the calculated metrics in a register and reading the metrics of the previous stage from the register when the next stage of the trellis is calculated.

15. The method as claimed in claim 9, further comprising
   a) reading a set of metrics from a memory as inputs to the ACS units,
   b) performing the calculation of the metrics of the next stage of the trellis in the ACS units,
   c) taking the obtained metrics from the outputs of the ACS units to the inputs of the ACS units for calculating the next stage of the trellis, repeating steps b) and c) one or more times.

16. The method as claimed in claim 15, further comprising repeating the steps b) and c) until $\log_Y P$ path metrics are calculated, wherein P is the number of data paths and Y is the number of branches from/to a state.

17. An arrangement for calculating a trellis, wherein the arrangement comprises one or more Add, Compare, Select ("ACS") units, and wherein connections between the inputs and outputs of the ACS units are implemented in such a manner that in calculating consecutive metrics of the trellis, the calculated metrics of the previous stage of the trellis obtained from the outputs of the ACS units are directly connected to the inputs of the ACS units to be used in the calculation of the next stage of the trellis and the arrangement further comprises a memory for storing the calculation results and that the connection between the inputs and outputs of the ACS units are implemented in such a manner that $\log_y P$ path metrics are calculated per one memory read/write operation pair, wherein P is the number of data paths and Y is the number of branches from/to a state.

* * * * *